(12) United States Patent
Moliton et al.

(10) Patent No.: US 8,278,947 B2
(45) Date of Patent: Oct. 2, 2012

(54) CAPACITIVE DIVIDER DEVICE, VOLTAGE SENSOR, TRIP DEVICE MODULE AND ELECTRICAL PROTECTION APPARATUS PROVIDED WITH SUCH A DEVICE

(75) Inventors: Vivien Moliton, Seyssins (FR);
François Vincent, La Buisse (FR)

(73) Assignee: Schneider Electric Industries SAS, Rueil Malmaison (FR)

( * ) Notice: Subject to any disclaimer, the term of this patent is extended or adjusted under 35 U.S.C. 154(b) by 419 days.

(21) Appl. No.: 12/591,490

(22) Filed: Nov. 20, 2009

(65) Prior Publication Data
US 2010/0156441 A1    Jun. 24, 2010

(30) Foreign Application Priority Data
Dec. 18, 2008    (FR) ...................................... 08 07110

(51) Int. Cl.
*G01R 27/26*    (2006.01)
(52) U.S. Cl. .................... 324/686; 361/301.4; 361/306.3
(58) Field of Classification Search .................. None
See application file for complete search history.

(56) References Cited

U.S. PATENT DOCUMENTS

| | | | |
|---|---|---|---|
| 5,166,858 A * | 11/1992 | Frake et al. | 361/313 |
| 6,819,543 B2 * | 11/2004 | Vieweg et al. | 361/306.3 |
| 6,933,551 B1 * | 8/2005 | Stribley et al. | 257/296 |
| 2005/0029623 A1 | 2/2005 | Kaneko | 257/532 |

FOREIGN PATENT DOCUMENTS
EP        0 631 144      12/1994
WO     WO 01/48824      7/2001

* cited by examiner

*Primary Examiner* — Minh N Tang
(74) *Attorney, Agent, or Firm* — Steptoe & Johnson LLP

(57) ABSTRACT

A multilayer capacitive divider having first and second main electrodes on the same level to apply an input voltage, and a common electrode on another level to supply an attenuated voltage, at least a first auxiliary electrode on yet another level, the electrodes arranged to form capacitive units, with the auxiliary electrode extending towards a side of the device towards which the second main electrode is arranged for connecting the auxiliary electrode to the second main electrode by a linear conductor. One such device also includes a voltage sensor, a trip device module and an electrical protection apparatus.

10 Claims, 8 Drawing Sheets

CAPACITIVE DIVIDER DEVICE, VOLTAGE SENSOR, TRIP DEVICE MODULE AND ELECTRICAL PROTECTION APPARATUS PROVIDED WITH SUCH A DEVICE

This application claims the benefit of French Application No. 08 07110, filed Dec. 18, 2008.

BACKGROUND OF THE INVENTION

The invention is in the field of capacitors formed in a multilayer structure, and in particular of capacitive dividers formed in such a structure.

The invention relates to a capacitive divider device designed to attenuate an input voltage, said device comprising electrodes formed on different levels of a multilayer structure separated by insulating layers, said electrodes including a first and second main electrode to apply said input voltage, and a common electrode to supply an attenuated voltage from said input voltage.

The invention also relates to a voltage sensor, a trip device module and an electrical protection apparatus provided with such a capacitive divider device.

STATE OF THE ART

European Patent application EP 0631144 describes a voltage sensor comprising two capacitive divider networks equipped with common terminals designed to provide an attenuated voltage, said networks comprising capacitors connected in series and integrated in multilayer structures. In these multilayer structures, the electrodes of these capacitors are formed by layers of polysilicone arranged on two at least partly overlapping levels electrically insulated by a dielectric layer.

One drawback of prior-art capacitive dividers is that they present a relatively high output impedance. These capacitive dividers are moreover formed on multilayer structures presenting significant dimensions that are directly dependent on the number of capacitors connected in series.

SUMMARY OF THE INVENTION

The object of the invention is to remedy the technical problems of capacitive dividers of the prior art by proposing a capacitive divider device designed to attenuate an input voltage, said device comprising electrodes formed on different levels of a multilayer structure separated by insulating layers, said electrodes including a first and second main electrode to apply said input voltage and a common electrode to supply an attenuated voltage from said input voltage, said capacitive divider being characterized in that said first and second main electrodes are formed on one and the same level of said structure, the common electrode being formed on another level of said structure, said common electrode being arranged so as to form a first capacitive unit with the first main electrode and to form a second capacitive unit with the second main electrode, that said device comprises at least a first auxiliary electrode formed on yet another level of the multilayer structure and arranged to form a first auxiliary capacitive unit with the common electrode, and that said auxiliary electrode and the second main electrode extend towards one side of the multilayer structure so as to electrically connect said auxiliary electrode to the second main electrode via a linear conductor.

The common electrode is preferably formed on a consecutive level with respect to the level of said first and second main electrodes.

The capacitive divider device preferably comprises a plurality of auxiliary electrodes formed on specific levels of the multilayer structure, each auxiliary electrode being arranged so as to form an auxiliary capacitive unit with the auxiliary electrode formed on a consecutive specific level, said auxiliary electrodes being connected either to the second main electrode or to the common electrode so as to obtain a parallel connection of each auxiliary capacitive unit with the second capacitive unit.

According to one embodiment, the capacitive divider device comprises a predetermined number N of auxiliary electrodes formed on specific levels of the multilayer structure presenting ranks going from 1 to N, the specific level of the first auxiliary electrode corresponding to rank 1, an auxiliary electrode arranged on a specific level of odd rank being connected to the second main electrode, an auxiliary electrode arranged on a specific level of even rank being connected to the common electrode. Advantageously, each auxiliary electrode formed on a specific level of odd rank extends towards the side of the multilayer structure in which the second main electrode is arranged, each auxiliary electrode formed on a specific level of even rank and the common electrode extending towards a laterally opposite side so as to connect the electrodes to one another by means of linear conductors. Preferably, at least one linear conductor passes through consecutive levels of the multilayer structure.

The specific levels of each auxiliary electrode preferably correspond to consecutive levels of the multilayer structure.

The invention also relates to a voltage sensor comprising:
two input terminals of an input voltage,
a capacitive divider device connected to said input terminals to supply an attenuated voltage according to said input voltage, and
a processing circuit connected to said divider device to supply a signal representative of said input voltage,
said sensor being characterized in that said capacitive divider device is a divider as described above, said input terminals being respectively connected to the first and second main electrode, said processing circuit being connected to the common electrode.

The processing circuit of the voltage sensor preferably comprises impedance matching means. The impedance matching means advantageously comprise a resistor connected in parallel with the capacitive unit, the value of said resistor being chosen such as to minimize the cut-off frequency with respect to the operating frequency.

The invention also relates to a trip device module for an electrical protection apparatus, said module comprising at least one current sensor to measure the current flowing in at least one electric conductor protected by said apparatus and processing means to supply a tripping signal according to the value of said current, said module being characterized in that it comprises a voltage sensor as described above, said processing means comprising means for determining a power and/or a power factor connected to said current sensor and to said voltage sensor, said tripping signal depending among other things on the value of said power and/or of said power factor.

The invention also relates to an electrical protection apparatus designed to be installed on at least one electric conductor, said apparatus comprising a movable contact, an operating mechanism controlling opening or closing of said movable contact, and a trip device operating in conjunction with said mechanism to trigger opening of said movable contact in response to an electrical fault, said apparatus being characterized in that said trip device comprises a trip device module as described above, said module being provided with a voltage sensor and a current sensor.

The invention also relates to an electrical protection apparatus designed to be installed on at least one electric conductor, said apparatus comprising a movable contact, an operating mechanism controlling opening or closing of said movable contact, and a trip device operating in conjunction with said mechanism to trigger opening of said movable contact in response to an electrical fault, said trip device comprising a current sensor to measure the current flowing in said electric conductor and processing means to supply a tripping signal according to said current, said apparatus being characterized in that the trip device further comprises a voltage sensor as described above, said processing means comprising means for determining a power and/or a power factor connected to said current sensor and to said voltage sensor, said tripping signal depending on said value of the power and/or of said power factor.

DETAILED DESCRIPTION OF AN EMBODIMENT

Figure 1:
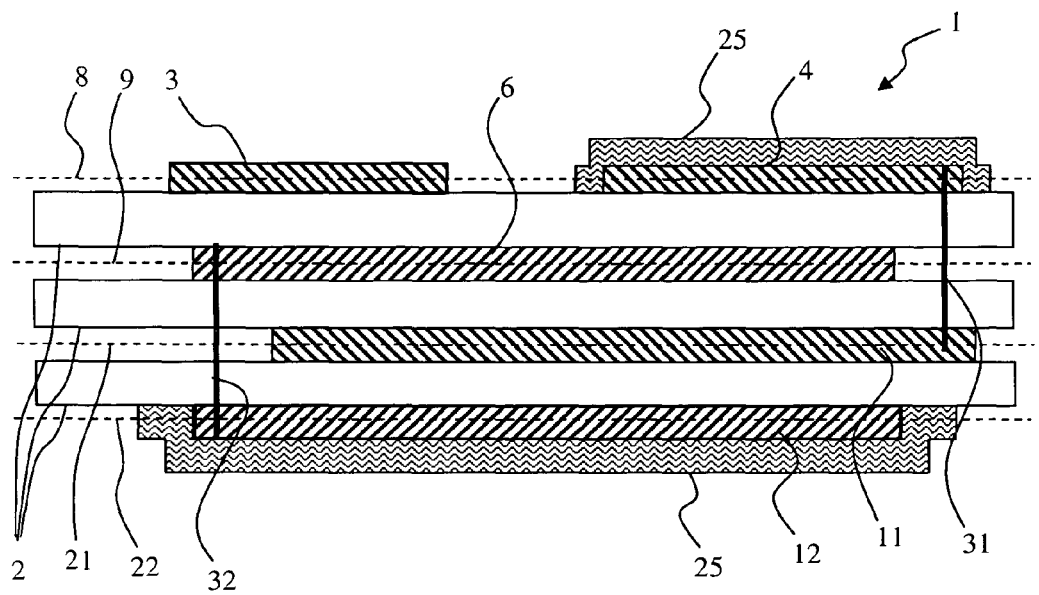
FIG. 1 represents a multilayer structure of a capacitive divider according to an embodiment of the invention.

With reference to FIG. 1, the capacitive divider is formed in a multilayer structure 1 comprising electrodes on several levels separated by insulating layers 2. The electrodes of the capacitive divider include a first main electrode 3 and a second main electrode 4 enabling an input voltage VE to be applied. The first and second main electrodes can also be respectively referred to as potential electrode and measurement electrode. Multilayer structure 1 also comprises a common electrode 6 to supply an attenuated voltage VS from input voltage VE. More precisely, the attenuated voltage is generally supplied between common electrode 6 and second electrode 4.

As can be seen in FIG. 1, first and second main electrodes 3, 4 are formed on the same level 8 of multilayer structure 1. Common electrode 6 is for its part formed on another level 9 of the multilayer structure.

Figure 2:
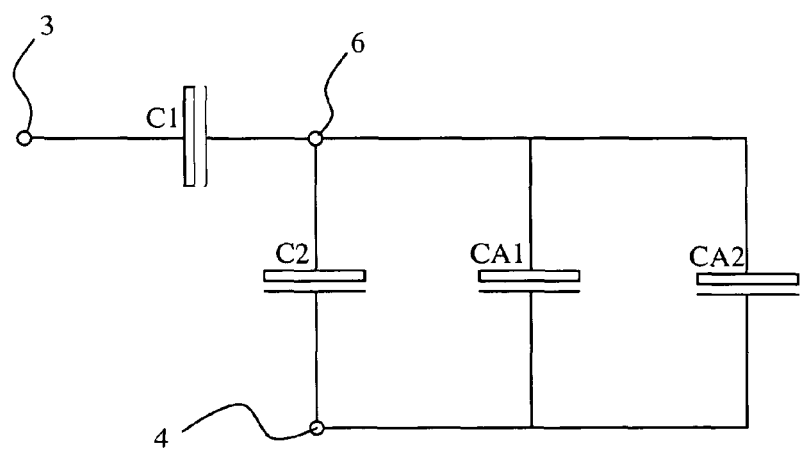
FIG. 2 is an equivalent representation of the multilayer structure of FIG. 1.

As can be seen in FIG. 2, common electrode 6 is arranged so as to form a first capacitive unit C1 with first main electrode 3 and to form a second capacitive unit C2 with second main electrode 4.

More precisely, in the embodiment represented in FIG. 1, common electrode 6 is formed on a consecutive level 9 with respect to level 8 of said first and second main electrodes. In other words, common electrode 6 is arranged facing each of first and second main electrodes 3, 4. The first capacitive unit is thus formed by first main electrode 3, common electrode 6 and insulating layer 2 separating said electrodes. In like manner, the second capacitive unit is formed by second main electrode 4, common electrode 6 and insulating layer 2 separating said electrodes. The capacitive units represented in FIG. 2 thus correspond to two capacitors C1, C2 comprising a common armature essentially formed by common electrode 6.

In other embodiments that are not represented, the common electrode could be formed on a non-consecutive level with respect to the level of said first and second main electrodes, i.e. a level farther away from the level of said first and second main electrodes, by placing several insulating layers and possibly intermediate electrodes between these two levels. For example, at least a part of the intermediate electrodes could be arranged so as to form a first capacitive unit, with the first main electrode and the common electrode, corresponding to capacitors connected in series. In the same way, at least a part of the intermediate electrodes could be arranged so as to form a second capacitive unit, with the second main electrode and the common electrode, corresponding to capacitors connected in series. Such an embodiment would among other things enable the voltage applied between each main electrode and the common electrode to be distributed over several capacitors connected in series so that the capacitive divider would be able to absorb higher voltages.

The capacitive divider represented in FIG. 1 further comprises two auxiliary electrodes 11, 12 formed on other specific levels of the multilayer structure, i.e. on the specific levels referenced 21 and 22. What is understood by specific level is one of the levels of the multilayer structure the specificity of which is that it comprises an auxiliary electrode. First auxiliary electrode 11 is arranged so as to form a first auxiliary capacitive unit with common electrode 6. More precisely, first auxiliary electrode 11 is formed on a specific level 21 which corresponds to a consecutive level with respect to level 9 on which common electrode 6 is formed. In other words, first auxiliary electrode 11 is arranged facing common electrode 6. The first auxiliary capacitive unit represented in FIG. 2 therefore corresponds to a capacitor CA1 comprising a common armature with capacitor C2.

As far as second auxiliary electrode 12 is concerned, the latter is arranged so as to form a second auxiliary capacitive unit with the auxiliary electrode formed on specific level 22. More precisely, second auxiliary electrode 12 is formed on a specific level 22 corresponding to a consecutive level with respect to level 21 on which first auxiliary electrode 11 is formed, i.e. auxiliary electrodes 11, 12 are arranged facing one another. Second auxiliary capacitive unit represented in FIG. 2 therefore corresponds to a capacitor CA2 comprising a common armature with capacitor CA1.

As represented in FIG. 1, the electrodes arranged on the faces of the multilayer structure can be totally or partially covered by an insulating varnish 25.

In the device represented in FIG. 1, specific levels 21, 22 of each auxiliary electrode 11, 12 correspond to consecutive levels of the multilayer structure. In other embodiments, not represented, the auxiliary electrodes could be formed on levels of the multilayer structure that are not consecutive by interposing several insulating layers and possibly intermediate electrodes between these non-consecutive levels. For example, these intermediate electrodes could be arranged so as to form auxiliary capacitive units, with the common electrode and the first auxiliary electrode or with a consecutive auxiliary electrode, these units corresponding to capacitors connected in series. Such an embodiment would among other things enable the voltage applied between the common electrode and the auxiliary electrodes to be distributed over several capacitors connected in series so that the capacitive divider would be able to absorb higher voltages.

In the embodiment represented in FIG. 1, first auxiliary electrode 11 is connected to second main electrode 4 by means of an electric conductor 31. In the same way, second auxiliary electrode 12 is connected to common electrode 6 by means of an electric conductor 32. The first second auxiliary capacitive units CA1, CA2 are thus connected in parallel with second capacitive unit C2.

Figure 3:
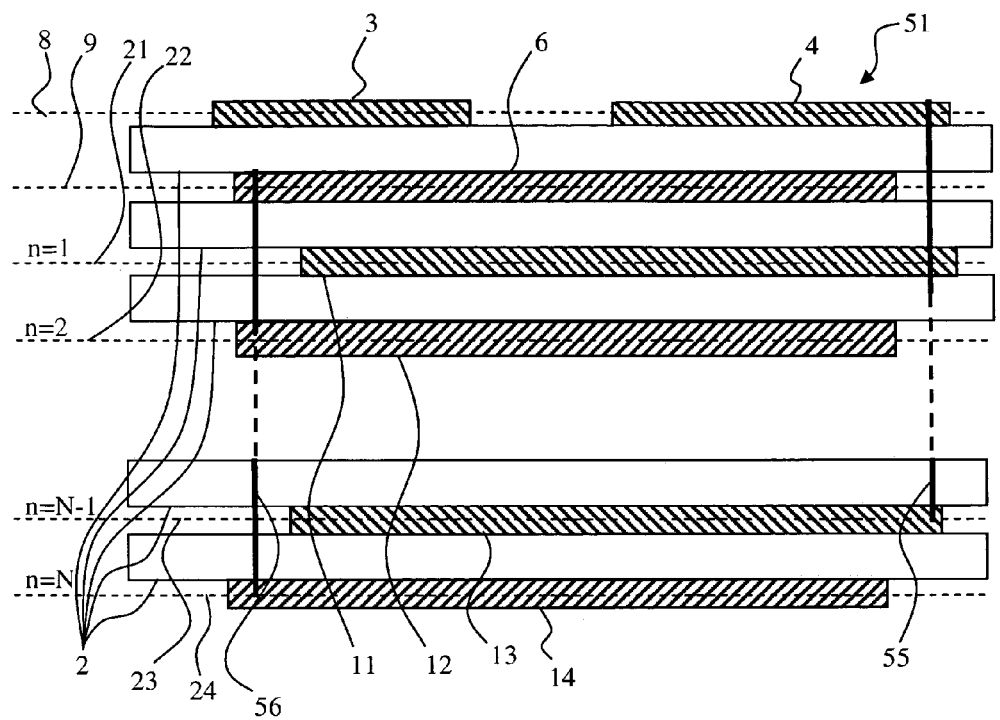
FIG. 3 represents another embodiment of a capacitive divider comprising a reduced output impedance compared with the embodiment represented in FIG. 1.
Figure 4:
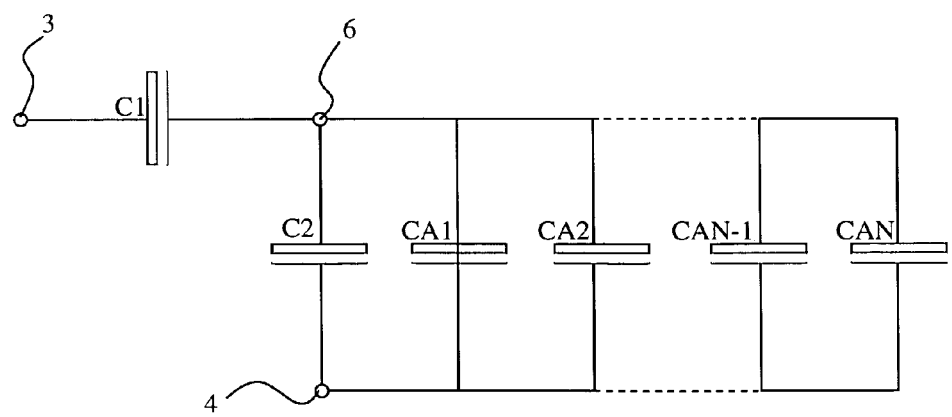
FIG. 4 is an equivalent representation of the multilayer structure of FIG. 3.

In the embodiment represented in FIG. 3, multilayer structure 51 comprises a number N of auxiliary electrodes 11, 12, 13, 14 formed on specific levels 21, 22, 23, 24 of the multilayer structure and presenting ranks going from 1 to N. Each auxiliary electrode 11, 12, 13, 14 is arranged so as to form an auxiliary capacitive unit CA1, CA2, CAN−1, CAN with the auxiliary electrode formed on a consecutive specific level, as represented in FIG. 4. Level 21 of first auxiliary electrode 11 corresponds to rank 1. The auxiliary electrodes arranged on a specific level of odd rank, such as electrodes 11 and 13 having the respective ranks 1 and N−1, are connected to second main electrode 4 by means of an electric conductor 55. The auxiliary electrodes arranged on a specific level of even rank are for their part connected to common electrode 6 by means of an electric conductor 56, as is the case of electrodes 12 and 14 the respective ranks of which are 2 and N.

As can be seen in FIG. 4, due to these electrical connections of the auxiliary electrodes with second main electrode 4 or common electrode 6, capacitive units CA1, CA2, CAN−1, CAN are connected in parallel with second capacitive unit C2. In this way, multiplication of the auxiliary electrodes enables the value of the equivalent capacitance between common electrode 6 and second main electrode 4 to be significantly increased. In this way, the input impedance of the processing circuit connected between common electrode 6 and second main electrode 4, described in the following, is minimized.

Multiplication of the auxiliary electrodes implies an increased thickness of the multilayer structure by adding additional layers, the length and width of said structure remaining unchanged. The thickness of the multilayer structure can be greater than a few tens of microns, in particular greater than 50 microns, for example 150 microns. The thickness of the multilayer structure generally depends on the number of levels. The thickness of the multilayer structure between each level can be less than 50 microns, for example equal to 45 microns. The increased size resulting therefrom remains very limited compared with a multilayer structure comprising a smaller number of layers on which the electrodes would have been multiplied in the lengthwise and/or widthwise direction.

In the embodiment represented in FIGS. 1 and 3, each auxiliary electrode 11, 13 formed on a level of odd rank 1, N−1 extends towards a side of the multilayer structure on which second main electrode 4 is arranged. Each auxiliary electrode 11, 13 formed on a level of odd rank 1, N−1 in fact extends here to the right of multilayer structure 1, 51, extending beyond auxiliary electrodes 12, 14 formed on a level of even rank 2, N, i.e. each electrode formed on a level 12, 14 of even rank is laid back with respect to the side of the multilayer structure on which second main electrode 4 is arranged. Each auxiliary electrode 12, 14 formed on a level of even rank 2, N, and common electrode 6 for their part extend towards a side laterally opposite from the side of the multilayer structure on which second main electrode 4 is arranged. Each auxiliary electrode 12, 14 formed on a level of even rank 2, N in fact extends here to the left of multilayer structure 1, 51, extending beyond auxiliary electrodes 11, 13 formed on a level of even rank 1, N−1, i.e. each electrode formed on a level 11, 13 of odd rank is laid back with respect to the side laterally opposite the multilayer structure. Due to this configuration, the electrodes are connected to one another by means of linear conductors 31, 32, 55, 56 passing through the insulating layers. These linear conductors 31, 32, 55, 56 are also referred to as vias.

In other embodiments that are not represented, the extensions of the auxiliary electrodes and of the common electrode on both sides, as described above, could extend up to the edge of the multilayer structure. In this way, the linear conductors could be arranged on the edges of each side of the multilayer structure.

The electrodes can be manufactured from any electrically conducting material such as for example copper or aluminium. The insulating layers can for their part be manufactured from any dielectric material such as for example epoxy compounds or polyimide compounds, for example kapton.

The multilayer structure of the capacitive divider is generally obtained by any known printed circuit fabrication technology. In this way, capacitive dividers are obtained at low cost and with a good reproducibility. The shape of these multilayer structures does not matter and can be adapted to the shape of the supports on which they are arranged. Electrical connection between the capacitive divider and the associated processing circuit can be achieved by any means known to the person skilled in the trade. For example, this connection can be made by means of an electric conducting wire soldered between electrodes 4 and 6 of the capacitive divider and input terminals of the processing circuit. Advantageously the connecting electrodes of the multilayer structure and the insulating layers supporting the latter can be extended to be connected to the processing circuit. Generally the extensions of the connecting electrodes and their associated insulating layers are flexible, which makes the connections flexible. The processing circuit and the capacitive divider are preferably formed on the same substrate.

One advantage of the capacitive dividers described above is that they are made on the same substrate or on the same multilayer structure. The first and second capacitive units therefore use the same dielectric. This configuration means that measurement of the attenuated voltage VS is more stable in temperature.

The capacitive dividers described above can be used in any electrical apparatus in which voltage measurement is required. They are often used as voltage sensors or are integrated in voltage sensor.

The capacitive dividers described above can advantageously be used in voltage sensors such as those used in electrical protection apparatus trip devices. The trip device of an electrical protection apparatus generally comprises current sensors to measure the current flowing in the electric conductors to be protected. According to the value of this current, the trip device can send a tripping command signal to open the movable contacts. A protection is thereby obtained that is often referred to as thermal protection. The combined use of current sensors and voltage sensors in the trip device further makes it possible to determine the power and/or power factor in the electric conductors to be protected. In this way, the tripping command can be activated not only according to the value of the electric current but also according to the value of the voltage, or even according to the power and/or power factor values calculated according to the voltage and current. Improved thermal protection is thus obtained.

Figure 5:
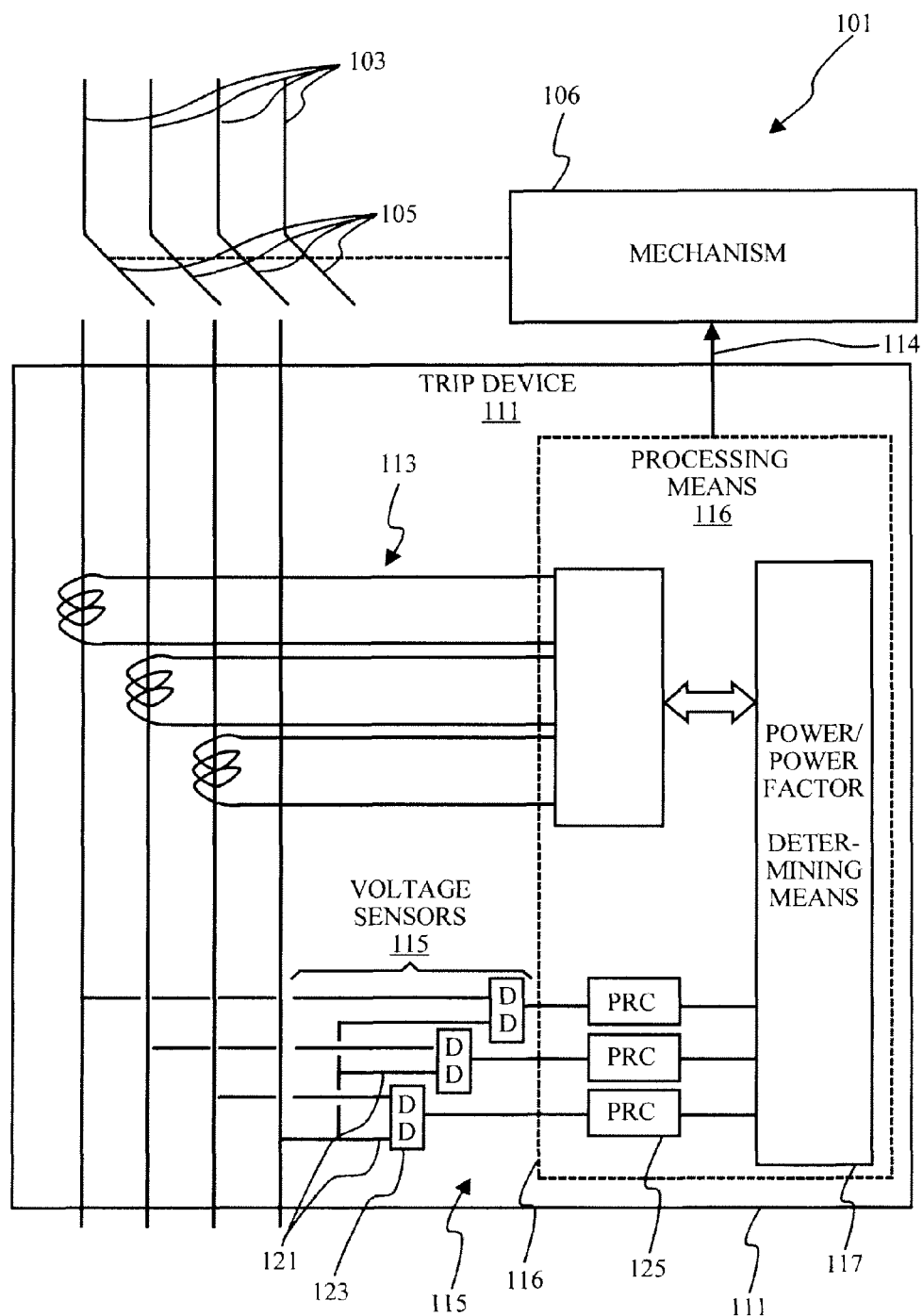
FIG. 5 is a schematic view of an electrical protection apparatus according to the invention.

With reference to FIG. 5, such an electrical protection apparatus referenced 101 enables electric conductors 103 to be protected by activating opening of movable contacts 105 arranged on said conductors. Opening of movable contacts 105 is performed via a mechanism 106 operating in conjunction with said movable contacts. Electrical protection apparatus 101 is equipped with a trip device 111 comprising current sensors 113 measuring the intensity of the current flowing in conductors 103 and able to send a tripping command signal 114 to mechanism 106 according to the value of said current. Trip device 111 further comprises processing means 116 supplying tripping command signal 114. Processing means 116 are generally in the form of an electronic circuit on which the current sensor coils are connected. The processing means generally, among other things, make it possible to determine the values of a function of the current representative of overheating of the equipment to be protected, for example a motor connected downline from electrical protection apparatus 101. This function of the current representative of overheating can be equal to the product of the square of the current multiplied by a time. When the value of this function exceeds a preset threshold, processing means 116 of trip device 111 generate and send a tripping command signal 114 to trip device mechanism 106 to open the movable contacts on the lines to be protected.

In the electrical protection apparatus represented in FIG. 5, trip device 111 further comprises three voltage sensors 115 for measuring the voltage between electric conductors 103. Trip device processing means 116 are connected not only to the current sensor coils but also to capacitive dividers 123 of voltage sensors 115. In the embodiment of FIG. 5, current and voltage sensors 113, 115 are connected to means 117 for determining the power and/or power factor integrated in processing means 116 of trip device 111. These power and/or power factor values can be used to generate tripping command signal 114 and if required to enable the energy efficiency of the installation protected by the electrical protection apparatus to be estimated.

Each voltage sensor 115 comprises two input terminals 121 of an input voltage VE, a capacitive divider device (DD) 123 connected to said input terminals to supply an attenuated voltage VS according to said input voltage, and a processing circuit (PRC) 125 connected to said divider device to supply a signal representative of said input voltage. Capacitive divider 123 is integrated in a multilayer structure as described in the foregoing comprising a first and second main electrode 3, 4, represented in FIGS. 1 and 3, respectively connected to said input terminals 121. The capacitive divider also comprises a common electrode 6, also represented in FIGS. 1 and 3, connected to processing circuit 125, said circuit forming part of processing means 116 of trip device 111. More precisely, attenuated voltage VS of each capacitive divider 123 is supplied between common electrode 6 and second main electrode 4, these two electrodes being connected to processing circuit 125. Processing circuit 125 comprises filtering or impedance matching means enabling an almost infinite input impedance and a reduced output impedance to be obtained while at the same time maintaining a unitary voltage gain. Two embodiments of these impedance matching means are represented in FIGS. 6 and 7.

Figure 6:
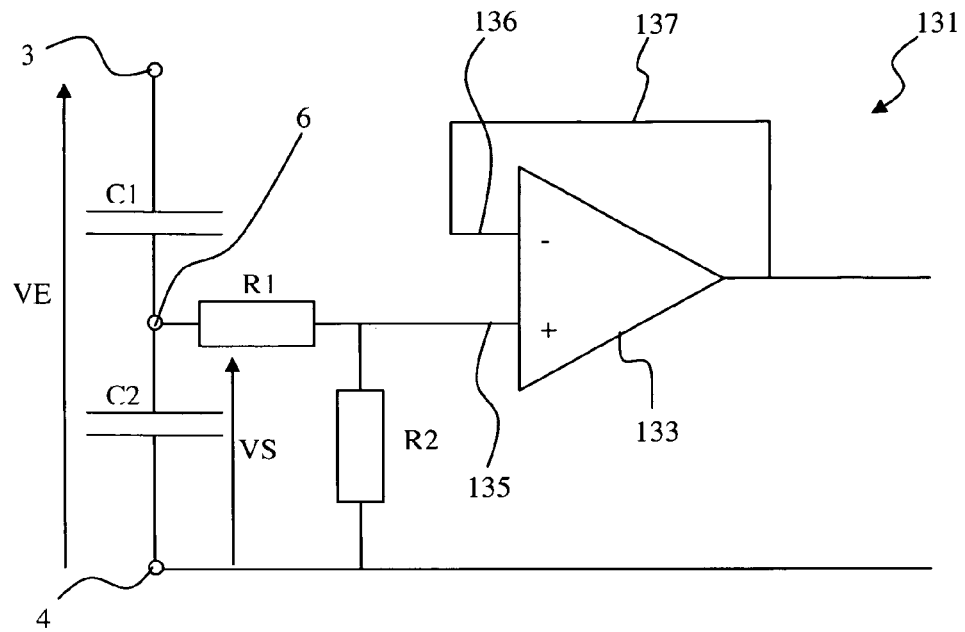
FIG. 6 represents a first embodiment of the impedance matching means of a voltage sensor according to the invention.

With reference to FIG. 6, impedance matching means 131 are connected between common electrode 6 and second main electrode 4, i.e. between the armatures of second capacitive unit C2. Impedance matching means 131 comprise amplifying means 133 provided with a non-inverting input 135, an inverting input 136, and a feedback loop 137 on said inverting input. Amplifying means 133 are in fact essentially formed by an operational amplifier connected in follower mode. Common electrode 6 of the capacitive divider device is connected to the non-inverting input by means of the resistive means.

In the embodiment represented in FIG. 6, the resistive means comprise a first resistor R1 connected between non-inverting input 135 and common electrode 6 of the capacitive divider device. The resistive means further comprise a second resistor R2 connected between non-inverting input 135 and second main electrode 4. This second resistor R2 is a bias resistor enabling the operational amplifier to be biased for correct operation of the follower assembly. The impedance value of first and second resistors R1, R2 connected in series is generally chosen much higher than the impedance of first and second capacitive units C1, C2 connected in parallel, for operating frequencies that are often 50 or 60 Hz. In this way the voltage sensor operates correctly and in repeatable manner whatever the temperature variations.

Figure 7:
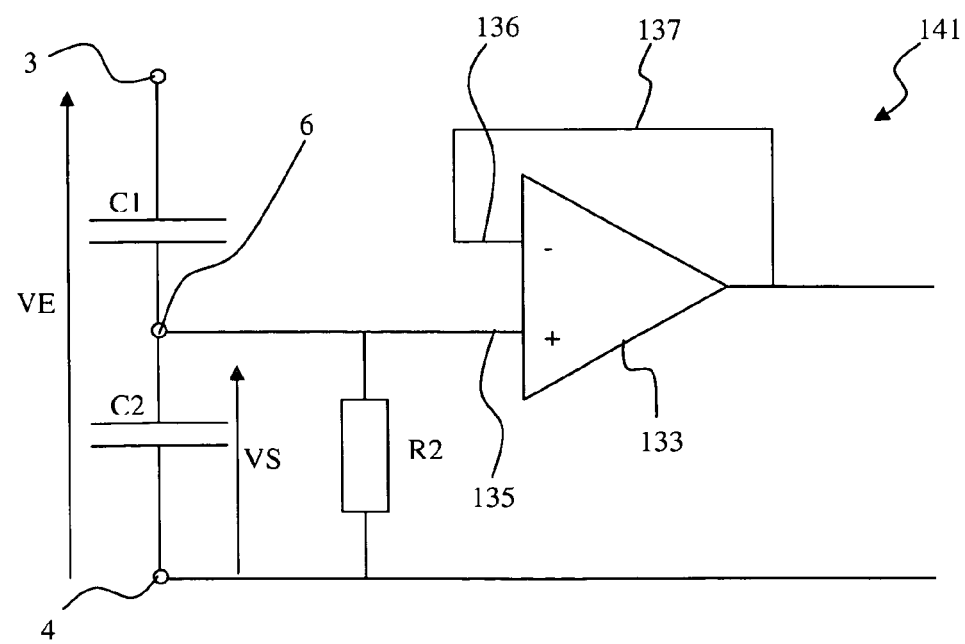
FIG. 7 represents a second embodiment of the impedance matching means of a voltage sensor according to the invention.

In the embodiment represented in FIG. 7, impedance matching means 141 comprise most of the components described above. Unlike the assembly represented in FIG. 6, the resistive means between common electrode 6 of the capacitive divider device and the non-inverting input do not comprise a first resistor R1. In other words, non-inverting input 135 is directly connected to common electrode 6 of the capacitive divider device. The impedance value of second resistance R2 is generally chosen much higher than the impedance of first and second capacitive units C1, C2 connected in parallel, for operating frequencies that are often 50 or 60 Hz. In this way the voltage sensor operates correctly and in repeatable manner whatever the temperature variations.

In the assembly represented in FIG. 6, first and second resistors R1, R2 form a divider bridge. In order not to impair voltage measurement, these resistors R1, R2 generally have to present a low tolerance. The cut-off frequency of such a device generally has to be chosen at least ten times lower than the lowest operating frequency, the latter here being equal to 50 or 60 Hz. For this, a second resistor R2 presenting a high impedance can be chosen, for example around several millions ohms. These resistors are however generally costly and may be difficult to procure. The use of a multilayer structure as described above enables a capacitive unit C2 with minimum dimensions to be used having a higher capacitance able to be associated with a second resistance R2 of lower value. The temperature stability of the device is thereby ensured.

In the assembly of FIG. 7, the impedance of second resistor R2 being much higher than that of second capacitive unit C2, the tolerance of second resistor R2 can be larger without impairing the performances, and the procurement cost problems brought up above are thereby minimized.

Figure 8:
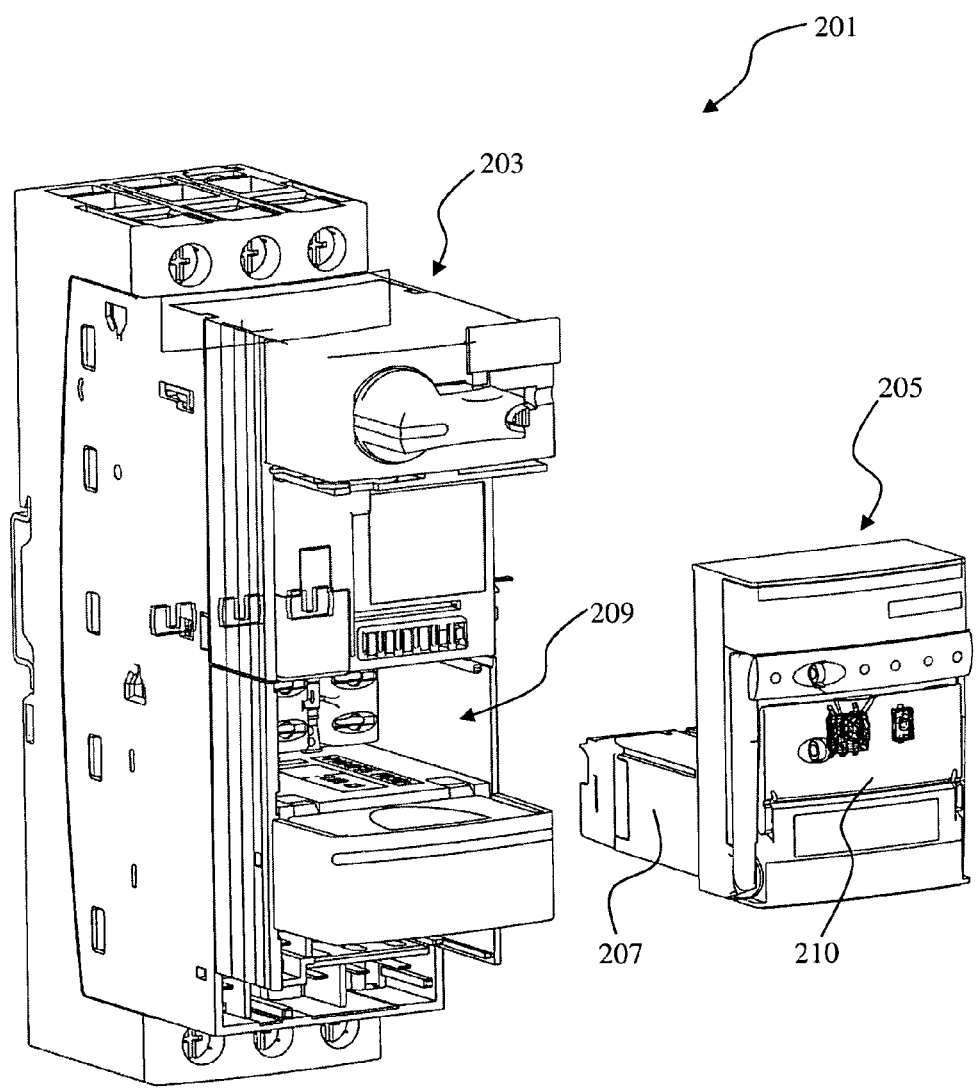
FIG. 8 is a perspective view of an electrical protection apparatus according to an embodiment of the invention.

The capacitive divider described above can be implemented on any electrical protection apparatus such as a power control apparatus represented in FIG. 8. This apparatus, which presents an electrical protection function, is also called full motor feeder.

With reference to FIG. 8, power control apparatus 201 comprises disconnecting means, short-circuit protection means, thermal protection means and a contactor. More precisely, apparatus 201 comprises a base 203 comprising electric conductors of the power lines to be protected, movable contacts on said conductors, a trip mechanism to open the movable contacts in response to an electrical fault, and a contactor. Apparatus 201 also comprises a trip device enabling a tripping command signal to be sent to the trip mechanism in response to an electrical fault. This trip device can also be referred to as control unit and constitute the "intelligent" part of power control apparatus 201. This trip device generally comprises the short-circuit protection means and the thermal protection means. In the embodiment represented, this trip device is in the form of a module 205 detachable from base 203.

As represented in FIG. 8, module 205 is provided with a case comprising a first part 207 designed to be inserted through an opening 209 of base 203. In the embodiment presented, this first part 207 of the case contains all the connections with base 205. The case of module 205 further comprises a second front part 210 in which the processing means are housed among other things enabling a tripping signal to be generated and sent to the trip mechanism housed in the base.

Figure 9:
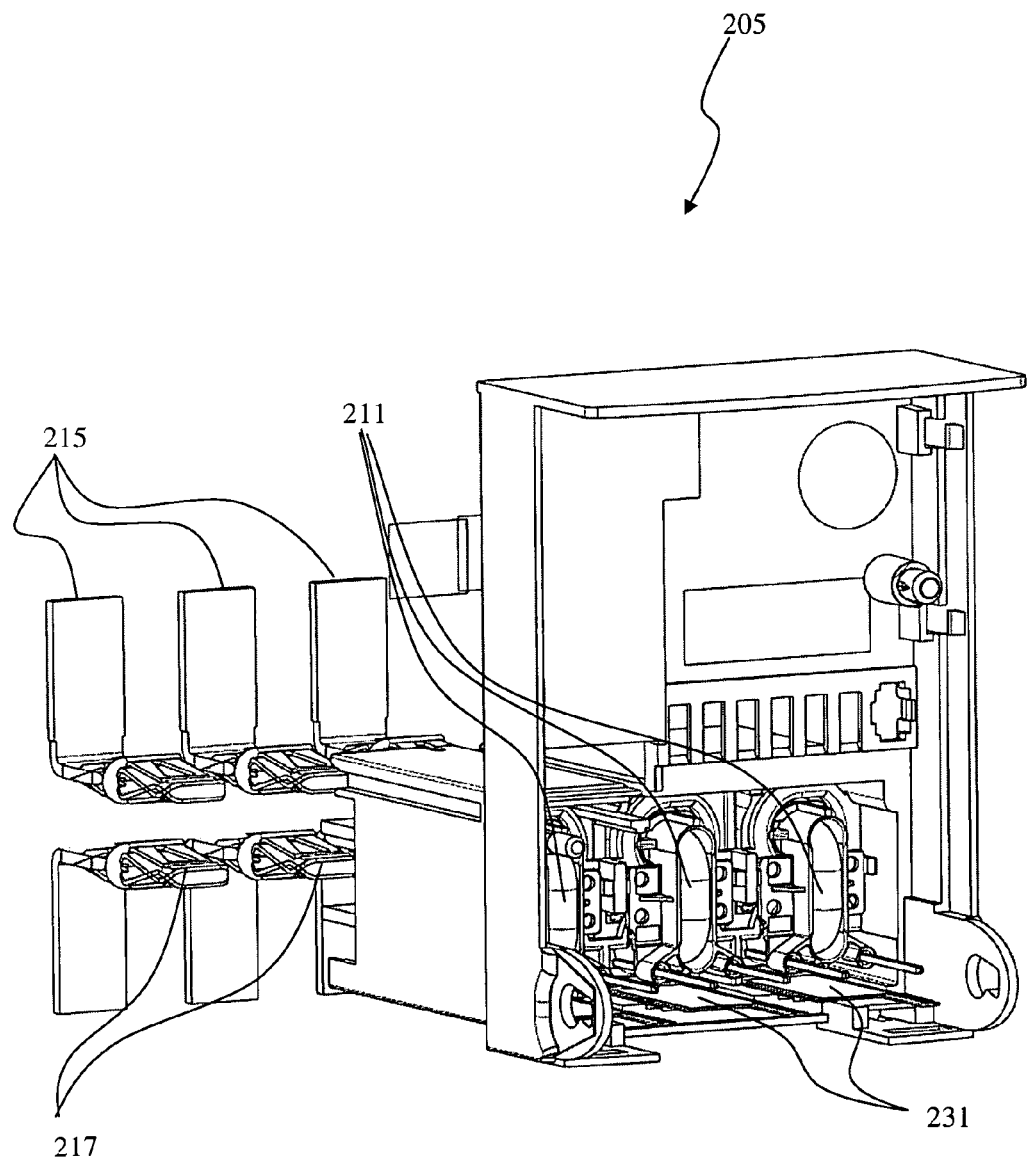
FIG. 9 is a perspective view of the innards of a trip device module of the electrical protection apparatus represented in FIG. 8.
Figure 10:
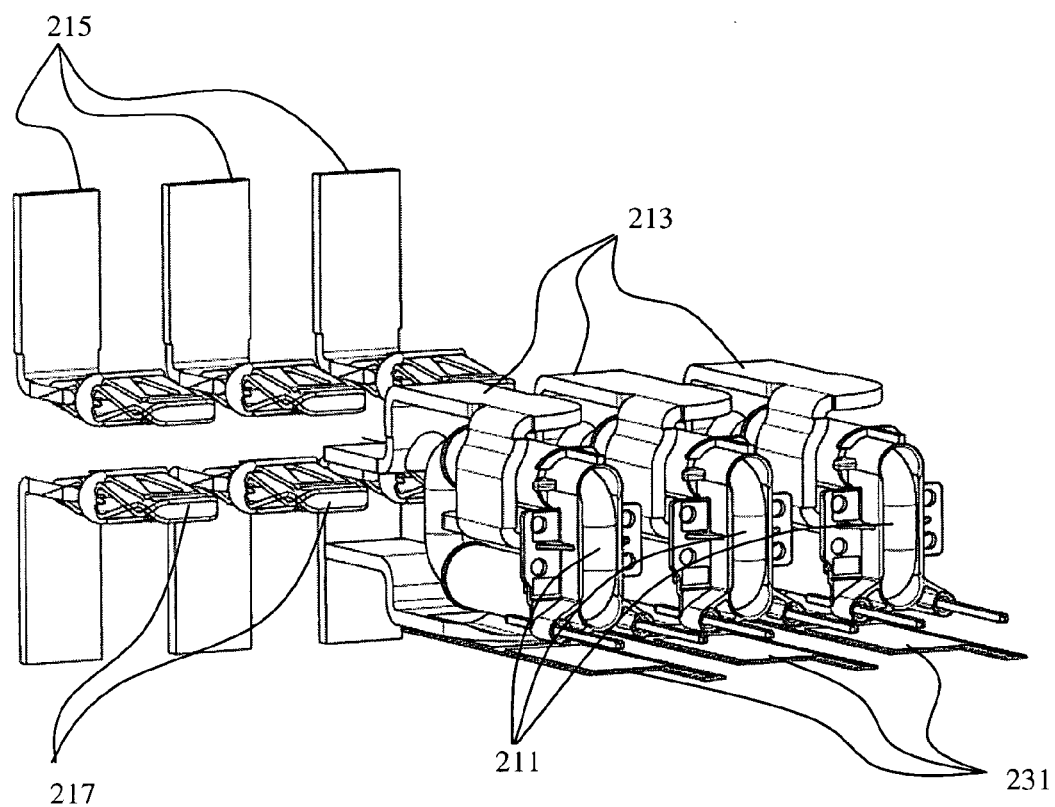
FIG. 10 is a perspective view showing the current sensors and the voltage sensors of the module represented in FIG. 9.
Figure 11:
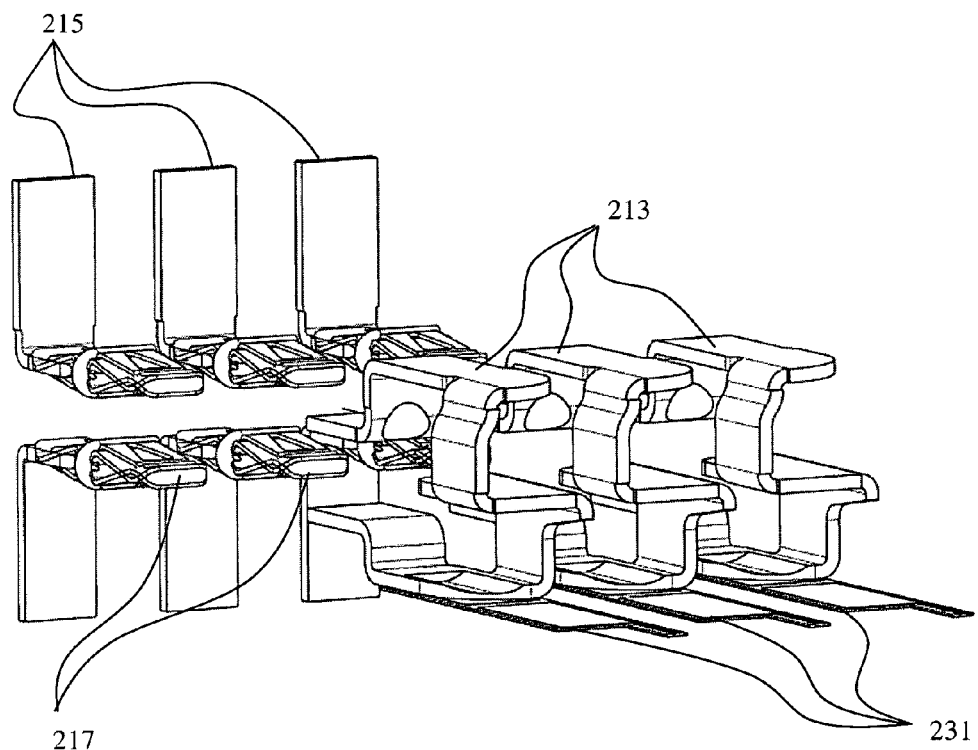
FIG. 11 is a perspective view showing the electric conductors on which the current sensors and voltage sensors of the module represented in FIG. 9 are fitted.

As can be seen in FIGS. 9 and 10, trip device module 205 comprises three current sensors 211, in this instance Rogowski coils, measuring the current flowing in the electric conductors to be protected. The current sensors are wound around electric conductors 213 transported to module 205 and visible in FIGS. 10 and 11. FIG. 11 is like FIG. 10, but, for clarity, does not include current sensors 211. These electric conductors 213 of module 205 are connected to electric conductors 215 of base 203 by means of grip-fasten connectors 217. As can be seen in FIG. 10, electric conductors 213 of module 205 are shaped in such a way as to be able to receive current sensors 211 with a minimum space occupation. In this way the volume of first part 207 of the case of module 205 is minimized.

To achieve improved thermal protection, trip device module 205 comprises voltage sensors. As can be seen in FIG. 9, most of the volume of first part 207 of the case is occupied by electric conductors 213 and current sensors 211. The space available for connecting and housing the voltage sensors is therefore very small.

It has been found that the use of a voltage sensor presenting a multilayer structure as described in the foregoing would enable said sensors to be housed in the reduced and encumbered space of first part 207 of the case of module 205. More precisely, as can be seen in FIGS. 9 to 11, the voltage sensors comprise capacitive divider devices 231 directly fixed onto a face of each electric conductor 213 of module 205. The fixing means able to be used can be a conducting glue, a solder, or any means known to obtain a direct electric contact between an electric conductor and an electrode of the capacitive divider devices. Due to the small dimensions of the multilayer structures in which the capacitive divider devices are formed, said devices can be housed in the reduced space between electric conductor 213 and first part 207 of the case.

The capacitive divider devices described in the above, and also any voltage sensor equipped with such a device, are particularly suitable for any electrical apparatus comprising a large number of components or components of large size arranged in a limited space.

The invention claimed is:

1. A capacitive divider device designed to attenuate an input voltage, said device comprising electrodes on different levels of a multilayer structure separated by insulating layers, said electrodes including a first and second main electrode to apply said input voltage, and a common electrode to supply an attenuated voltage from said input voltage, wherein said first and second main electrodes are on the same level of said structure, the common electrode is on another level of said structure, said common electrode is arranged to form a first capacitive unit with the first main electrode and a second capacitive unit with the second main electrode, wherein said device comprises at least a first auxiliary electrode on yet another level of the multilayer structure and arranged to form a first auxiliary capacitive unit with the common electrode, and wherein said auxiliary electrode and the second main electrode extend towards one side of the multilayer structure to electrically connect said auxiliary electrode to the second main electrode via a linear conductor, said device additionally comprising a plurality of auxiliary electrodes on specific levels of the multilayer structure, each auxiliary electrode arranged to form an auxiliary capacitive unit with the auxiliary electrode on a consecutive specific level, said auxiliary electrodes connected either to the second main electrode or to the common electrode to obtain a parallel connection of each auxiliary capacitive unit with the second capacitive unit.

2. The device according to claim 1, comprising a predetermined number of auxiliary electrodes formed on specific levels of the multilayer structure presenting ranks going from 1 to N, the specific level of the first auxiliary electrode corresponding to rank 1, an auxiliary electrode arranged on a specific level of odd rank being connected to the second main electrode, an auxiliary electrode arranged on a specific level of even rank being connected to the common electrode.

3. The device according to claim 2, wherein each auxiliary electrode formed on a specific level of odd rank extends towards the side of the multilayer structure in which the second main electrode is arranged, each auxiliary electrode formed on a specific level of even rank and the common electrode extending towards a laterally opposite side so as to connect the electrodes to one another by means of linear conductors.

4. The device according to claim 1, wherein the specific levels of each auxiliary electrode correspond to consecutive levels of the multilayer structure.

5. A voltage sensor comprising:
two input terminals of an input voltage,
a capacitive divider device connected to said input terminals to supply an attenuated voltage according to said input voltage, and
a processing circuit connected to said divider device to supply a signal representative of said input voltage,
wherein said capacitive divider device is designed to attenuate an input voltage, said device comprising electrodes on different levels of a multilayer structure separated by insulating layers, said electrodes including a first and second main electrode to apply said input voltage, and a common electrode to supply an attenuated voltage from said input voltage,
wherein said first and second main electrodes are on the same level of said structure, the common electrode is on another level of said structure, said common electrode is arranged to form a first capacitive unit with the first main electrode and a second capacitive unit with the second main electrode,
wherein said device comprises at least a first auxiliary electrode on yet another level of the multilayer structure and arranged to form a first auxiliary capacitive unit with the common electrode,
and wherein said auxiliary electrode and the second main electrode extend towards one side of the multilayer structure to electrically connect said auxiliary electrode to the second main electrode via a linear conductor, said input terminals being respectively connected to the first and second main electrode, and said processing circuit being connected to the common electrode.

6. The voltage sensor according to claim 5, wherein the processing circuit comprises impedance matching means.

7. The voltage sensor according to claim 6, wherein the impedance matching means comprise a resistor connected in parallel with the capacitive unit, the value of said resistor being chosen such as to minimize the cut-off frequency with respect to the operating frequency.

8. A trip device module for an electrical protection apparatus, said module comprising at least one current sensor to measure the current flowing in at least one electric conductor protected by said apparatus and processing means to supply a tripping signal according to the value of said current, wherein said module comprises a voltage sensor according to claim 5, said processing means comprising means for determining a power and/or a power factor connected to said current sensor and to said voltage sensor, said tripping signal depending among other things on the value of said power and/or of said power factor.

9. An electrical protection apparatus designed to be installed on at least one electric conductor, said apparatus comprising a movable contact, an operating mechanism controlling opening or closing of said movable contact, and a trip device operating in conjunction with said mechanism to trigger opening of said movable contact in response to an electrical fault, wherein said trip device comprises a trip device module according to claim 8.

10. An electrical protection apparatus designed to be installed on at least one electric conductor, said apparatus comprising a movable contact, an operating mechanism controlling opening or closing of said movable contact, and a trip device operating in conjunction with said mechanism to trigger opening of said movable contact in response to an electrical fault, said trip device comprising a current sensor to measure the current flowing in said electric conductor and processing means to supply a tripping signal according to said current, wherein the trip device further comprises a voltage sensor according to claim 5, said processing means comprising means for determining a power and/or a power factor connected to said current sensor and to said voltage sensor, said tripping signal depending on said value of the power and/or of said power factor.

* * * * *